(12) United States Patent
Tone et al.

(10) Patent No.: US 9,792,000 B2
(45) Date of Patent: Oct. 17, 2017

(54) SYSTEM CONSTRUCTION ASSISTANCE APPARATUS, METHOD, AND RECORDING MEDIUM

(71) Applicant: Mitsubishi Electric Corporation, Tokyo (JP)

(72) Inventors: Yuzuru Tone, Tokyo (JP); Masaru Nagashima, Tokyo (JP); Takayuki Amano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/906,354

(22) PCT Filed: Mar. 18, 2014

(86) PCT No.: PCT/JP2014/057409
§ 371 (c)(1),
(2) Date: Jan. 20, 2016

(87) PCT Pub. No.: WO2014/140940
PCT Pub. Date: Sep. 24, 2015

(65) Prior Publication Data
US 2016/0162129 A1 Jun. 9, 2016

(51) Int. Cl.
*G06F 3/0482* (2013.01)
*G06F 3/0484* (2013.01)
(Continued)

(52) U.S. Cl.
CPC .......... *G06F 3/0482* (2013.01); *G05B 19/05* (2013.01); *G06F 3/0485* (2013.01);
(Continued)

(58) Field of Classification Search
CPC .... G06F 3/0482; G06F 3/04842; G06F 17/50; G05B 19/05
See application file for complete search history.

(56) References Cited

U.S. PATENT DOCUMENTS 5,903,454 A * 5/1999 Hoffberg ............... G06F 3/0482
382/155
5,963,671 A * 10/1999 Comerford ........... G06F 3/0237
345/168

(Continued)

FOREIGN PATENT DOCUMENTS

CN 103403721 A 11/2013
DE 102006059829 A1 6/2008
(Continued)

OTHER PUBLICATIONS

JPO Office Action for Application No. 2015-520761 dated Jun. 30, 2015.
(Continued)

*Primary Examiner* — Ryan Barrett
(74) *Attorney, Agent, or Firm* — Sughrue Mion, PLLC; Richard C. Turner

(57) ABSTRACT

A system construction assistance apparatus includes a first display screen, a second display screen, and a processing section displaying units each belonging to one of categories on the first display screen such that the units are sorted by category, receiving a first input to select one unit from the units displayed on the first display screen, generating a system configuration diagram on the basis of the received first input, and displaying the generated system configuration diagram on the second display screen. After a first input is newly received and before a next first input is received, the processing section predicts a category to which a unit to be selected by the next first input belongs on the basis of first inputs received in a past and presents the predicted category as a candidate category to a user.

18 Claims, 16 Drawing Sheets

(51) Int. Cl.
*G06F 17/50* (2006.01)
*G05B 19/05* (2006.01)
*G06F 3/0485* (2013.01)
*G06T 11/20* (2006.01)

(52) U.S. Cl.
CPC .......... *G06F 3/04842* (2013.01); *G06F 17/50* (2013.01); *G06T 11/206* (2013.01); *G06T 2200/24* (2013.01)

(56) References Cited

U.S. PATENT DOCUMENTS

| | | | | |
|---|---|---|---|---|
| 6,323,884 | B1* | 11/2001 | Bird | G06F 3/04812 715/810 |
| 6,573,844 | B1* | 6/2003 | Venolia | G06F 3/04886 341/22 |
| 2002/0040286 | A1* | 4/2002 | Inoko | G05B 19/05 703/13 |
| 2003/0080945 | A1* | 5/2003 | Betts-LaCroix | H01H 13/84 345/168 |
| 2006/0155398 | A1* | 7/2006 | Hoffberg | G05B 15/02 700/86 |
| 2006/0206217 | A1* | 9/2006 | Fujii | G05B 19/05 700/18 |
| 2006/0218502 | A1* | 9/2006 | Matthews | G06F 3/0482 715/779 |
| 2007/0061735 | A1* | 3/2007 | Hoffberg | G06F 9/4443 715/744 |
| 2007/0067744 | A1* | 3/2007 | Lane | G06F 3/0236 715/860 |
| 2008/0077874 | A1* | 3/2008 | Garbow | G06F 3/0486 715/764 |
| 2008/0122796 | A1* | 5/2008 | Jobs | G06F 3/0488 345/173 |
| 2008/0165035 | A1* | 7/2008 | Bhella | G06F 3/0238 341/23 |
| 2009/0040184 | A9* | 2/2009 | Pu | G01C 21/3611 345/171 |
| 2009/0113330 | A1* | 4/2009 | Garrison | G06F 3/0486 715/769 |
| 2009/0309886 | A1* | 12/2009 | Sneed | G06F 3/14 345/520 |
| 2010/0265181 | A1* | 10/2010 | Shore | G06F 3/0237 345/168 |
| 2010/0293457 | A1* | 11/2010 | Peterson | G06F 3/0236 715/261 |
| 2010/0313120 | A1* | 12/2010 | Ho | G06F 3/0237 715/261 |
| 2011/0041056 | A1* | 2/2011 | Griffin | G06F 3/0237 715/708 |
| 2011/0066984 | A1* | 3/2011 | Li | G06F 3/04883 715/863 |
| 2011/0078563 | A1* | 3/2011 | Archer | G06F 3/0237 715/261 |
| 2011/0078613 | A1* | 3/2011 | Bangalore | G06F 3/0237 715/773 |
| 2011/0210923 | A1* | 9/2011 | Pasquero | G06F 3/04886 345/173 |
| 2011/0264442 | A1* | 10/2011 | Huang | G06F 3/04886 704/9 |
| 2012/0036468 | A1* | 2/2012 | Colley | G06F 3/0418 715/773 |
| 2012/0047454 | A1* | 2/2012 | Harte | G06F 3/04886 715/773 |
| 2012/0324391 | A1* | 12/2012 | Tocci | G06F 3/0237 715/773 |
| 2013/0083030 | A1 | 4/2013 | Fukuda et al. | |
| 2013/0226331 | A1* | 8/2013 | Nakamura | G06F 17/50 700/121 |
| 2014/0075320 | A1 | 3/2014 | Sasaki et al. | |
| 2014/0078065 | A1* | 3/2014 | Akkok | G06F 3/04886 345/169 |
| 2014/0164973 | A1* | 6/2014 | Greenzeiger | G06F 3/04886 715/773 |

FOREIGN PATENT DOCUMENTS

| | | |
|---|---|---|
| JP | 9-251305 A | 9/1997 |
| JP | 2002-32118 A | 1/2002 |
| JP | 2010-160582 A | 7/2010 |
| JP | 2012-14561 A | 1/2012 |
| JP | 2012-194678 A | 10/2012 |
| JP | 2013-80351 A | 5/2013 |
| WO | WO 2012066683 A1 * | 5/2012 ............ G06F 17/50 |

OTHER PUBLICATIONS

International Search Report for PCT/JP2014/057409 dated Jun. 17, 2014 [PCT/ISA/210].
Written Opinion for PCT/JP2014/057409 dated Jun. 17, 2014 [PCT/ISA/237].
Communication dated Feb. 24, 2016 from the German Patent and Trademark Office in counterpart application No. 112014003146.1.
Communication dated Jun. 28, 2016 from the German Patent and Trademark Office in counterpart application No. 112014003146.1.
Communication dated Aug. 12, 2016, from the State Intellectual Property Office of People's Republic of China in counterpart Application No. 201480042336.2.

* cited by examiner

FIG.5

| MODEL NAME | ACCOMPANYING INFORMATION |
|---|---|
| Q33B | FUNDAMENTAL BASE, 3 SLOTS |
| Q35B | FUNDAMENTAL BASE, 5 SLOTS |
| Q32SB | SLIM FUNDAMENTAL BASE, 2 SLOTS |
| Q33SB | SLIM FUNDAMENTAL BASE, 3 SLOTS |
| Q63B | ADD-ON BASE, 3 SLOTS |
| Q65B | ADD-ON BASE, 5 SLOTS |
| Q02CPU | HIGH PERFORMANCE MODEL CPU |
| Q06HCPU | HIGH PERFORMANCE MODEL CPU |
| Q02UCPU | UNIVERSAL MODEL CPU |
| Q04UDHCPU | UNIVERSAL MODEL CPU |
| Q172HCPU | MOTION CPU |
| Q173HCPU | MOTION CPU |
| Q61P | POWER, 6A |
| Q62P | POWER, 3A |
| Q61SP | SLIM TYPE POWER, 2A |
| QX10 | INPUT UNIT, 16 POINTS, AC INPUT |
| QX40 | INPUT UNIT, 16 POINTS, COMMON PLUS |
| QY10 | OUTPUT UNIT, 16 POINTS, CONTACT OUTPUT |
| QY40P | OUTPUT UNIT, 16 POINTS, SINK TYPE |
| Q68ADV | ANALOG INPUT |
| Q68DAV | ANALOG OUTPUT |
| QJ71GP21-SX | CC IE Control |
| QJ71GF11-T2 | CC IE Field |

FIG.6

| CATEGORY | MODEL NAME |
|---|---|
| FUNDAMENTAL BASE | Q33B |
| | Q35B |
| | Q32SB |
| | Q33SB |
| ADD-ON BASE | Q63B |
| | Q65B |
| SEQUENCER CPU | Q02CPU |
| | Q06HCPU |
| | Q02UCPU |
| | Q04UDHCPU |
| MOTION CPU | Q172HCPU |
| | Q173HCPU |
| POWER UNIT | Q61P |
| | Q62P |
| | Q61SP |
| INPUT UNIT | QX10 |
| | QX40 |
| OUTPUT UNIT | QY10 |
| | QY40P |
| ANALOG INPUT UNIT | Q68ADV |
| ANALOG OUTPUT UNIT | Q68DAV |
| NETWORK UNIT | QJ71GP21-SX |
| | QJ71GF11-T2 |

FIG.10

|  | FUNDAMENTAL BASE | ADD-ON BASE | SEQUENCER CPU | MOTION CPU | POWER UNIT | INPUT UNIT | OUTPUT UNIT | ANALOG INPUT UNIT | ANALOG OUTPUT UNIT | NETWORK UNIT |
|---|---|---|---|---|---|---|---|---|---|---|
| FUNDAMENTAL BASE | 0 | 2 | 14 | 0 | 26 | 0 | 0 | 0 | 0 | 0 |
| ADD-ON BASE | 0 | 0 | 6 | 0 | 11 | 0 | 0 | 0 | 0 | 0 |
| SEQUENCER CPU | 0 | 0 | 0 | 1 | 11 | 14 | 12 | 2 | 2 | 9 |
| MOTION CPU | 0 | 0 | 0 | 0 | 2 | 5 | 2 | 0 | 0 | 0 |
| POWER UNIT | 0 | 0 | 20 | 0 | 0 | 7 | 9 | 1 | 0 | 2 |
| INPUT UNIT | 0 | 0 | 0 | 0 | 0 | 0 | 8 | 0 | 0 | 3 |
| OUTPUT UNIT | 0 | 0 | 0 | 0 | 0 | 6 | 0 | 0 | 0 | 0 |
| ANALOG INPUT UNIT | 0 | 0 | 0 | 0 | 0 | 0 | 0 | 0 | 0 | 2 |
| ANALOG OUTPUT UNIT | 0 | 0 | 0 | 0 | 0 | 0 | 0 | 0 | 0 | 1 |
| NETWORK UNIT | 0 | 0 | 0 | 0 | 0 | 0 | 0 | 0 | 0 | 2 |

| CATEGORY | MODEL NAME |
|---|---|
| FUNDAMENTAL BASE | Q33B |
| | Q35B |
| | Q32SB |
| | Q33SB |
| ADD-ON BASE | Q63B |
| | Q65B |
| SEQUENCER CPU | Q02CPU |
| | Q06HCPU |
| | Q02UCPU |
| | Q04UDHCPU |
| MOTION CPU | Q172HCPU |
| | Q173HCPU |
| POWER UNIT | Q61P |
| | Q62P |
| | Q61SP |
| INPUT UNIT | QX10 |
| | QX40 |
| OUTPUT UNIT | QY10 |
| | QY40P |
| ANALOG INPUT UNIT | Q68ADV |
| ANALOG OUTPUT UNIT | Q68DAV |
| NETWORK UNIT | QJ71GP21-SX |
| | QJ71GF11-T2 |

22-2

| CATEGORY | MODEL NAME |
|---|---|
| BASE UNIT | Q33B |
| | Q35B |
| | Q32SB |
| | Q33SB |
| | Q63B |
| | Q65B |
| CPU UNIT | Q02CPU |
| | Q06HCPU |
| | Q02UCPU |
| | Q04UDHCPU |
| | Q172HCPU |
| | Q173HCPU |
| POWER UNIT | Q61P |
| | Q62P |
| | Q61SP |
| INPUT/OUTPUT UNIT | QX10 |
| | QX40 |
| | QY10 |
| | QY40P |
| ANALOG UNIT | Q68ADV |
| | Q68DAV |
| NETWORK UNIT | QJ71GP21-SX |
| | QJ71GF11-T2 |

FIG.16

| No. | MODEL NAME | NUMBER LIMITATION | UNITS DEEMED IDENTICAL |
|---|---|---|---|
| 1 | Q33B | 1 | 1,2,3,4 |
| 2 | Q35B | 1 | 1,2,3,4 |
| 3 | Q32SB | 1 | 1,2,3,4 |
| 4 | Q33SB | 1 | 1,2,3,4 |
| 5 | Q63B | 7 | 5,6 |
| 6 | Q65B | 7 | 5,6 |
| 7 | Q02CPU | 4 | 7,8,9,10,11,12 |
| 8 | Q06HCPU | 4 | 7,8,9,10,11,12 |
| 9 | Q02UCPU | 4 | 7,8,9,10,11,12 |
| 10 | Q04UDHCPU | 4 | 7,8,9,10,11,12 |
| 11 | Q172HCPU | 4 | 7,8,9,10,11,12 |
| 12 | Q173HCPU | 4 | 7,8,9,10,11,12 |
| 13 | Q61P | 8 | 13,14,15 |
| 14 | Q62P | 8 | 13,14,15 |
| 15 | Q61SP | 8 | 13,14,15 |
| 16 | QX10 | – | – |
| 17 | QX40 | – | – |
| 18 | QY10 | – | – |
| 19 | QY40P | – | – |
| 20 | Q68ADV | – | – |
| 21 | Q68DAV | – | – |
| 22 | QJ71GP21-SX | 4 | 22,23 |
| 23 | QJ71GF11-T2 | 4 | 22,23 |

SYSTEM CONSTRUCTION ASSISTANCE APPARATUS, METHOD, AND RECORDING MEDIUM

CROSS REFERENCE TO RELATED APPLICATIONS

This application is a National Stage of International Application No. PCT/JP2014/057409, filed on Mar. 18, 2014, the contents of all of which are incorporated herein by reference in their entirety.

FIELD

The present invention relates to a system construction assistance apparatus that assists in constructing a system that uses a programmable controller (PLC), a method, and a computer readable recording medium that stores a program for assisting in constructing a system that uses a PLC.

BACKGROUND

It is conventional to use PLCs as controllers for industrial machines and the like. PLCs are configured by combining various units, for example, a power unit, which is a power source; a CPU unit, which centrally controls an overall PLC system; a motion CPU unit, which controls a servomotor via a servo amplifier attached to a drive unit of a production device or a facility device; an input unit, which receives signals of a switch or a sensor attached to an appropriate point on the production device or the facility device; an output unit, which transmits control signals to an actuator or the like; and a communication unit for connection to a communication network.

Before actually constructing a system, users need to carefully consider which units should be selected from the various units that are available, what layout is rational for the selected units, what setting is rational for relay relationships, etc. This is when users can use a system construction assistance apparatus.

System construction assistance apparatuses are capable of displaying a display object that corresponds to each unit at a designated position on a screen. Such a system construction assistance apparatus generates a system configuration diagram on the basis of the units represented by the display objects and the positions where they are placed. This allows the user to select units and consider the entire configuration of a system while referring to the generated system configuration diagram.

Here, the user needs to select units to be placed on the screen from many units when generating a system configuration diagram by using a system construction assistance apparatus. With regard to this point, when one unit is selected, a system construction assistance apparatus according to a technique described in Patent Literature 1, for example, predicts a unit that is likely to be selected following the selected unit on the basis of history and presents it to the user. This reduces the time taken by the user to search for a unit.

CITATION LIST

Patent Literature

Patent Literature 1: Japanese Patent Application Laid-Open No. 2010-160582

SUMMARY

Technical Problem

The present invention has been achieved in view of the above, and an object of the present invention is to provide a system construction assistance apparatus with improved convenience for the user.

Solution to Problem

In order to solve the above problems and achieve the object, an aspect of the present invention is a system construction assistance apparatus, including: a first display screen; a second display screen; and a processing section that displays, on the first display screen, a plurality of units each belonging to one of a plurality of categories such that the units are sorted by category, receives a first input to select one unit from the units displayed on the first display screen, generates a system configuration diagram on a basis of the received first input, and displays the generated system configuration diagram on the second display screen, wherein, after a first input is newly received and before a next first input is received, the processing section predicts a category to which a unit to be selected by the next first input belongs on a basis of a plurality of first inputs received in a past and presents the predicted category as a candidate category to a user.

Advantageous Effects of Invention

The system construction assistance apparatus according to the present invention predicts a unit to be selected next, not on a per unit basis, but on a per category basis, which is a larger basis than the per unit basis, thereby enabling improvement in accuracy of prediction when compared with prediction on a per unit basis even if the number of inputs to select a unit is small. Thus, the system construction assistance apparatus according to the present invention can improve convenience for the user.

BRIEF DESCRIPTION OF DRAWINGS

FIG. 5 is a diagram illustrating an example data configuration of a unit list.

FIG. 6 is a diagram illustrating an example data configuration of classification information.

FIG. 10 is a diagram illustrating an example data configuration of second summary information.

FIG. 12 is a diagram illustrating another example data configuration of the classification information.

FIG. 16 is a diagram illustrating an example data configuration of maximum placement number information.

DESCRIPTION OF EMBODIMENTS

A system construction assistance apparatus, a method, and a recording medium according to embodiments of the present invention will be described below in detail with reference to the drawings. The present invention is not limited to the embodiments.

First Embodiment

Figure 1:
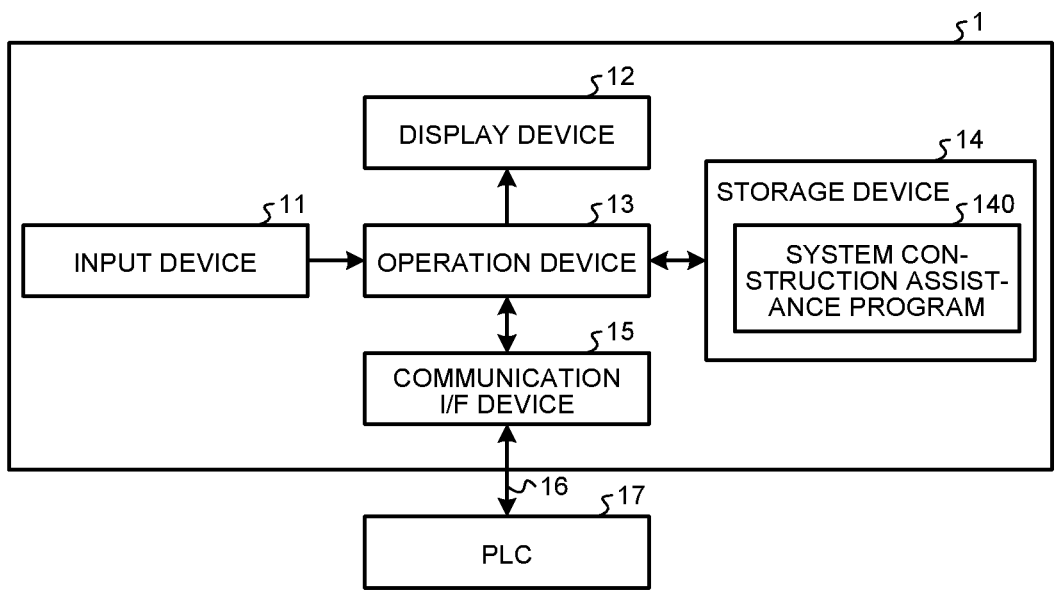
FIG. 1 is a diagram illustrating an exemplary hardware configuration of a system construction assistance apparatus in a first embodiment.

FIG. 1 is a diagram illustrating an exemplary hardware configuration of a system construction assistance apparatus in a first embodiment. A system construction assistance apparatus 1 (hereinafter referred to simply as an "assistance apparatus 1") is connectable to a PLC 17 via a communication line 16.

The PLC 17 includes a base unit for, for example, physically and electrically connecting a plurality of units together. The base unit includes slots that are each connectable to one unit.

The PLC 17 may include a CPU unit, an input unit, and an output unit. The CPU unit accepts a signal received from the input unit in an I/O memory of the CPU unit and executes a logical operation based on a sequence program using the accepted signal. The sequence program is set in the PLC 17 by the assistance apparatus 1 in advance. The CPU unit writes the result of the executed logical operation based on the sequence program in the I/O memory to transmit the result to the output unit and then executes what is called peripheral processing. The CPU unit cyclically executes a series of processing including the access to the I/O memory, the logical operation, and the peripheral processing.

The PLC 17 may include a motion CPU unit. The motion CPU unit generates a motion command in accordance with a motion program and transmits the generated motion command to a servo amplifier. The motion CPU unit drives a servomotor by transmitting the motion command to the servo amplifier. The motion CPU unit can also receive a state detection value of the servomotor (speed detection value or position detection value) and feed back the received state detection value to the motion command.

The motion CPU unit is controlled by the CPU unit. In other words, an execution directing command (call instruction) for the motion CPU unit is described in the sequence program. When the call instruction is processed, the CPU unit of the PLC 17 transmits an execution command of a motion program to the motion CPU unit. On receiving the execution command from the CPU unit, the motion CPU unit processes the designated motion program.

The assistance apparatus 1 generates a system configuration diagram and displays the diagram on a display screen. The system configuration diagram displayed on the display screen can be used to assist the user in considering the selection of units to be included in the PLC 17, the connection relationship, such as which slot of the base unit should be connected to each unit, and the like. Note that the assistance apparatus 1 manages information on various settings (parameters and user programs) to be set in the PLC 17. For example, the assistance apparatus 1 can either assist in creating the information on various settings or gather information on various settings created by using another tool on a per system basis. The information on various settings managed by the assistance apparatus 1 is transmitted via the communication line 16 to the PLC 17 to be set therein. Parameters include setting information to allocate various units to the I/O memory. User programs include a sequence program and a motion program. The assistance apparatus 1 may have functions to verify parameters for consistency and to simulate actions of the PLC 17.

The assistance apparatus 1 includes, as main hardware, an input device 11, a display device 12, an operation device 13, a storage device 14, and a communication interface (I/F) device 15.

The input device 11 is, for example, a keyboard or a pointing device and can receive an input action from the user. The information on the input action received by the input device 11 is transmitted to the operation device 13. The display device 12 is, for example, an LCD (Liquid Crystal Display). The operation device 13 generates an image frame for the display screen and transmits the generated image frame to the display device 12. The display device 12 displays the received image frame. The communication I/F device 15 is an interface for communication with the PLC 17 via the communication line 16.

The storage device 14 includes, for example, a plurality of memory parts. The types of memory parts included in the storage device 14 depend on the design. For example, the storage device 14 includes a main memory in which the operation device 13 stores temporary data for operation, storage in which retention data is stored, and a recording medium that stores in advance a system construction assistance program 140. As the main memory, a storage device that the operation device 13 can quickly access is employed, e.g., a DRAM (Dynamic Random Access Memory). As the storage, any nonvolatile storage device can be employed. For example, an HDD (Hard Disk Drive) or a flash memory is employed as the storage. The system construction assistance program 140 is a computer program to be executed by the operation device 13. As the recording medium that stores in advance the system construction assistance program 140, any computer readable medium can be employed. For example, an HDD (Hard Disk Drive), a flash memory, a removable memory device, a magnetic disk, or an optical disk is employed as the recording medium.

The operation device 13 is, for example, a CPU (Central Processing Unit). The operation device 13 realizes the functions and actions of the assistance apparatus 1 by executing the system construction assistance program 140 stored in the storage device 14.

Figure 2:
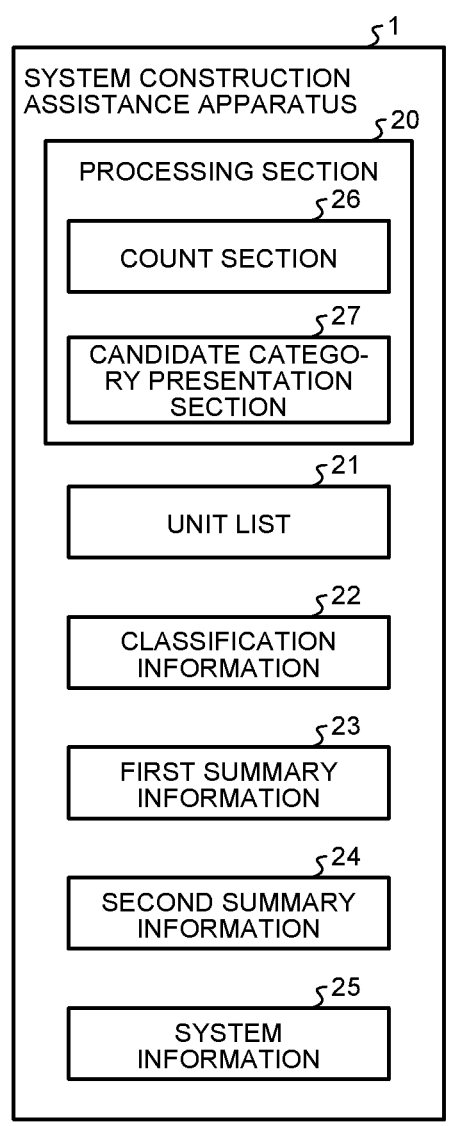
FIG. 2 is a diagram describing the functions of the system construction assistance apparatus in the first embodiment.

FIG. 2 is a diagram describing the function blocks of the assistance apparatus 1. The assistance apparatus 1 includes a processing section 20, a unit list 21, classification information 22, first summary information 23, second summary information 24, and system information 25. To allow for resumption of processing after a restart of the assistance apparatus 1, the unit list 21, the classification information 22, the first summary information 23, the second summary information 24, and the system information 25 are retained in the storage within the storage device 14 at least when the power is off. Some of or all of the unit list 21, the classification information 22, the first summary information 23, the second summary information 24, and the system information 25 may be retained in the main memory within the storage device 14 when the assistance apparatus 1 is in operation.

The operation device 13 functions as the processing section 20 under the control of the system construction assistance program 140. The processing section 20 causes the display device 12 to display a list of selectable units and a unit configuration diagram. The display screen has a GUI function. More specifically, the processing section 20 receives an editing input to a unit configuration displayed on the display screen and updates the unit configuration diagram on the display screen on the basis of the received editing input. The processing section 20 records the unit configuration indicated by a unit configuration diagram being displayed in the system information 25. In other words, the system information 25 includes at least information that identifies each unit included in the PLC and information that identifies the connection relationship between the units included in the PLC. When a unit configuration diagram being displayed is edited and changed, the processing section 20 sequentially reflects the content of the change in the system information 25. The system information 25 may include setting information (parameters and user programs) for the PLC 17.

Figure 3:
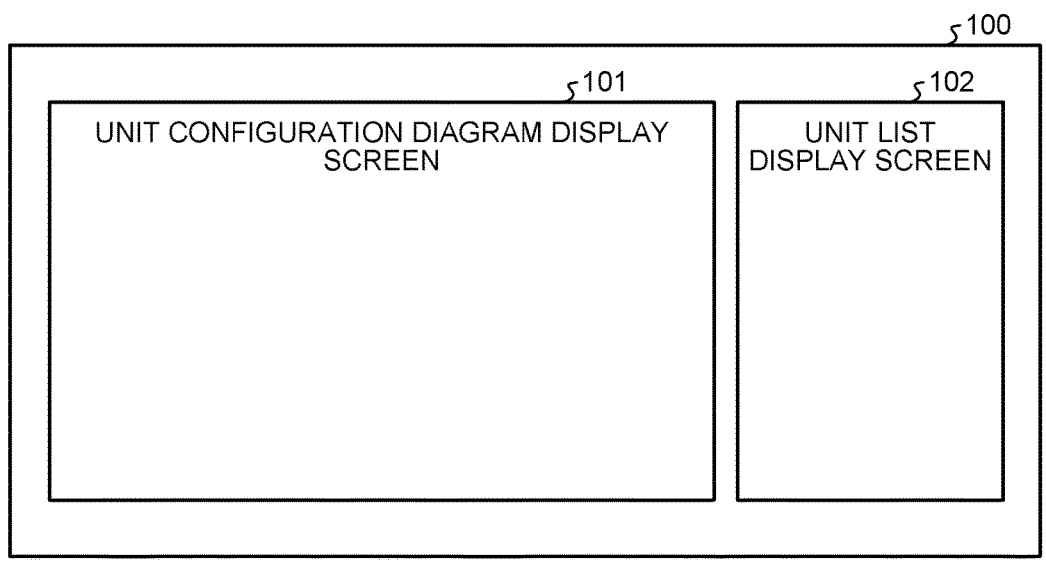
FIG. 3 is a diagram illustrating an example display screen displayed on a display device.

FIG. 3 is a diagram illustrating an example display screen that the processing section 20 displays on the display device 12. As illustrated, a display screen 100 includes a unit configuration diagram display screen 101, which is an area that displays a unit configuration diagram, and a unit list display screen 102, which is an area that displays a list of selectable units. It is assumed for the description here that the unit list display screen 102 displays a list of unit names (model names). The unit list display screen 102 may display images indicative of respective units.

Figure 4:
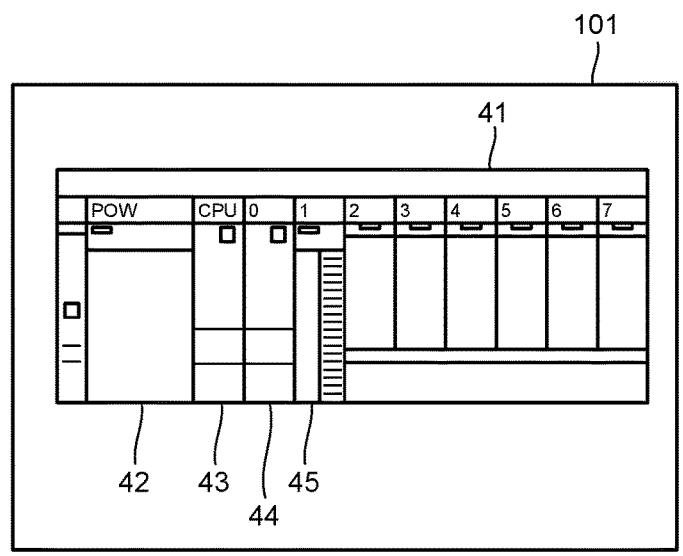
FIG. 4 is a diagram illustrating an example of the display of a unit configuration diagram display screen.

FIG. 4 is a diagram illustrating an example of the display of the unit configuration diagram display screen 101. A system configuration diagram has a form that facilitates recognizing which unit is connected to each slot of a base unit. For example, the system configuration diagram includes components on a per unit basis that are mutually connected such that their connections correspond to the connection relationships between the units. A component is a display object indicative of a unit and is a minimum unit that can be displayed and moved in the unit configuration diagram display screen 101. In the example in FIG. 4, a component 41 is illustrated, which is indicative of a base unit that includes a power slot (POW), a CPU slot (CPU), and eight slots to which the numbers 0 to 7 are assigned in ascending order from the CPU slot side. A component 42, which is indicative of a power unit, is displayed such that it is superimposed on the power slot; a component 43, which is indicative of a CPU unit, is displayed such that it is superimposed on the CPU slot; and a component 44 and a component 45, which are indicative of other units, are displayed such that they are superimposed on the slots 0 and 1. This represents the power unit being connected to the power slot, the CPU unit being connected to the CPU slot, and the two other units being connected to the slots 0 and 1. It also represents the slots 2 to 7 being unused slots. The processing section 20 may be capable of handling a plurality of components as one new component when the components are grouped by the user.

On receiving an input to select one unit from the units being displayed on the unit list display screen 102 (a unit selection input), the processing section 20 displays a component indicative of the selected unit in the unit configuration diagram display screen 101. An input to select a unit is, for example, an action to drag and drop one of the units being displayed on the unit list display screen 102 into the unit configuration diagram display screen 101. The processing section 20 may display the component indicative of the selected unit at a position at which the component is dropped by the action. Furthermore, on receiving an input to move a component being displayed (for example, an action to drag and drop the component), the processing section 20 can move the component. For example, on receiving an action to drag and drop the component 45 from the display position on the slot 1 to the display position on the slot 2, the processing section 20 moves the component 45 from the display position on the slot 1 to the display position on the slot 2. At the same time, the processing section 20 changes the connecting slot recorded in the system information 25 for the unit represented by the component 45 from the slot 1 to the slot 2 of the base unit represented by the component 41.

A unit selection input hereinafter refers to the actions from selecting one unit from the unit list display screen 102 to adding it to a unit group included in a PLC. Here, when a component is placed on the unit configuration diagram display screen 101, a unit represented by the component is added to the unit group included in a PLC.

The unit list 21 is information in which a list of selectable units is recorded. The classification information 22 is information in which is recorded which one of categories each unit recorded in the unit list 21 belongs to. The processing section 20 displays the units recorded in the unit list 21 on the unit list display screen 102 such that the units are sorted on the basis of the classification information 22.

FIG. 5 is a diagram illustrating an example data configuration of the unit list 21. In the unit list 21, the model names of units are recorded in a table format. In this example, the description of each unit is provided as accompanying information for each model name; however, such accompanying information may be eliminated from the unit list 21.

FIG. 6 is a diagram illustrating an example data configuration of the classification information 22. In the illustrated example, the types of units, such as a fundamental base, an add-on base, a sequencer CPU (CPU unit), and a motion CPU (motion CPU unit), are defined as categories. Each unit is classified into one of these categories. A fundamental base is a unit that functions as a stand-alone base unit. An add-on base is a kind of base unit. An add-on base is connected to a fundamental base when in use to increase the number of slots.

Figure 7:
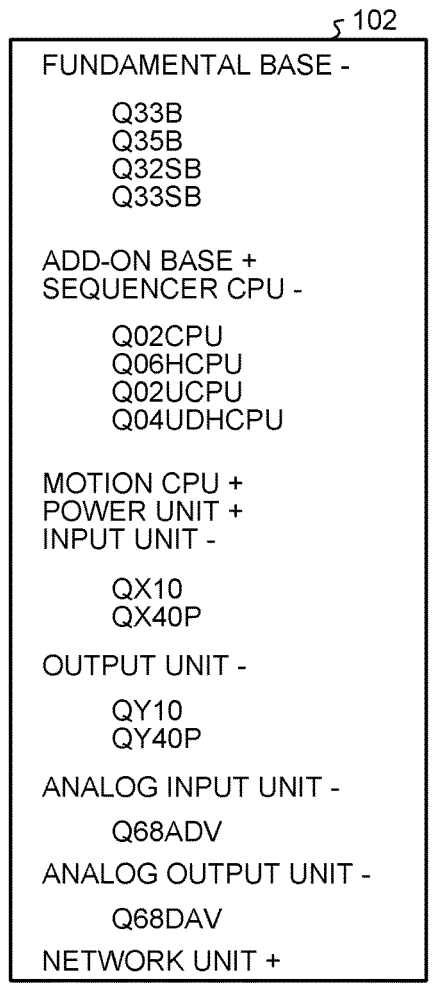
FIG. 7 is a diagram illustrating an example of the display of a unit list display screen.

FIG. 7 is a diagram illustrating an example of the display of the unit list display screen 102. The unit list display screen 102 illustrated in this figure displays the model names listed in the unit list 21 in FIG. 5 such that the model names are sorted by category on the basis of the classification information 22 in FIG. 6. All the units belonging to the same category are displayed successively under a category name representing the category that they belong to. A "+" or "−" button is placed on the right side of each category name. The user can press down the "+" button or the "−" button by using the input device 11 to provide an instruction as to whether the units of each category are displayed in the display form of a folded display or in the display form of an unfolded display. In other words, the processing section 20 displays the unit list display screen 102 such that the user can select for each category the display form of the folded display or the unfolded display. The folded display is a display form in which only a category name is displayed without a model name; and the unfolded display is a display form in which a category name and a model name are both displayed.

For example, the category "fundamental base" is displayed in the display form of the unfolded display. More specifically, the model names of the units belonging to the category "fundamental base" (a unit "Q33B", a unit "Q35B", a unit "Q32SB", and a unit "Q33SB") are displayed. The button "−" for the folded display is displayed on the right side of "fundamental base", which is the display of the category name. When the button "−" displayed on the right side of the display of the category name "fundamental base" is pressed down, the processing section 20 erases the display of the unit "Q33B", the unit "Q35B", the unit "Q32SB", and the unit "Q33SB" and changes the button "−" displayed on the right side of the category name "fundamental base" to the button "+". When the button "+" is then pressed down, the processing section 20 displays the unit "Q33B", the unit "Q35B", the unit "Q32SB", and the unit "Q33SB" again. The category "add-on base" is displayed below the category "fundamental base". When the category "fundamental base" is displayed in the display form of the folded display, the processing section 20 places the display of the category name "add-on base" close to the display of the category name "fundamental base". When the category "fundamental base" is displayed in the unfolded manner, the processing section 20 displays the model names of the four units belonging to the category "fundamental base" under the display of the category name "fundamental base" and displays the category name "add-on base" under the model names of the four units.

Figure 8:
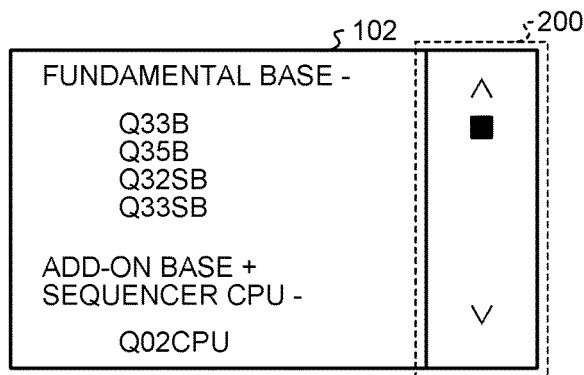
FIG. 8 is a diagram illustrating another example of the display of the unit list display screen.

When not all the model names cannot be displayed in the display space in the unit list display screen 102, the processing section 20 provides a scroll bar 200 for scrolling the display in the vertical direction, as illustrated in FIG. 8, to display some of the model names in the unit list display screen 102.

The processing section 20 in the first embodiment includes a count section 26 and a candidate category presentation section 27.

The count section 26 monitors the sequence of units selected by the unit selection inputs and counts the number of selections for each combination of one unit and another unit selected immediately before the one unit. For example, if units "A" to "C" are selected in the sequence of the unit "A", the unit "B", the unit "A", the unit "B", and the unit "C", the count value for the combination of the unit "A" and the unit "B" is "2", the count value for the combination of the unit "B" and the unit "A" is "1", and the count value for the combination of the unit "B" and the unit "C" is "1". The count section 26 records the count value of each combination in the first summary information 23.

Figure 9:
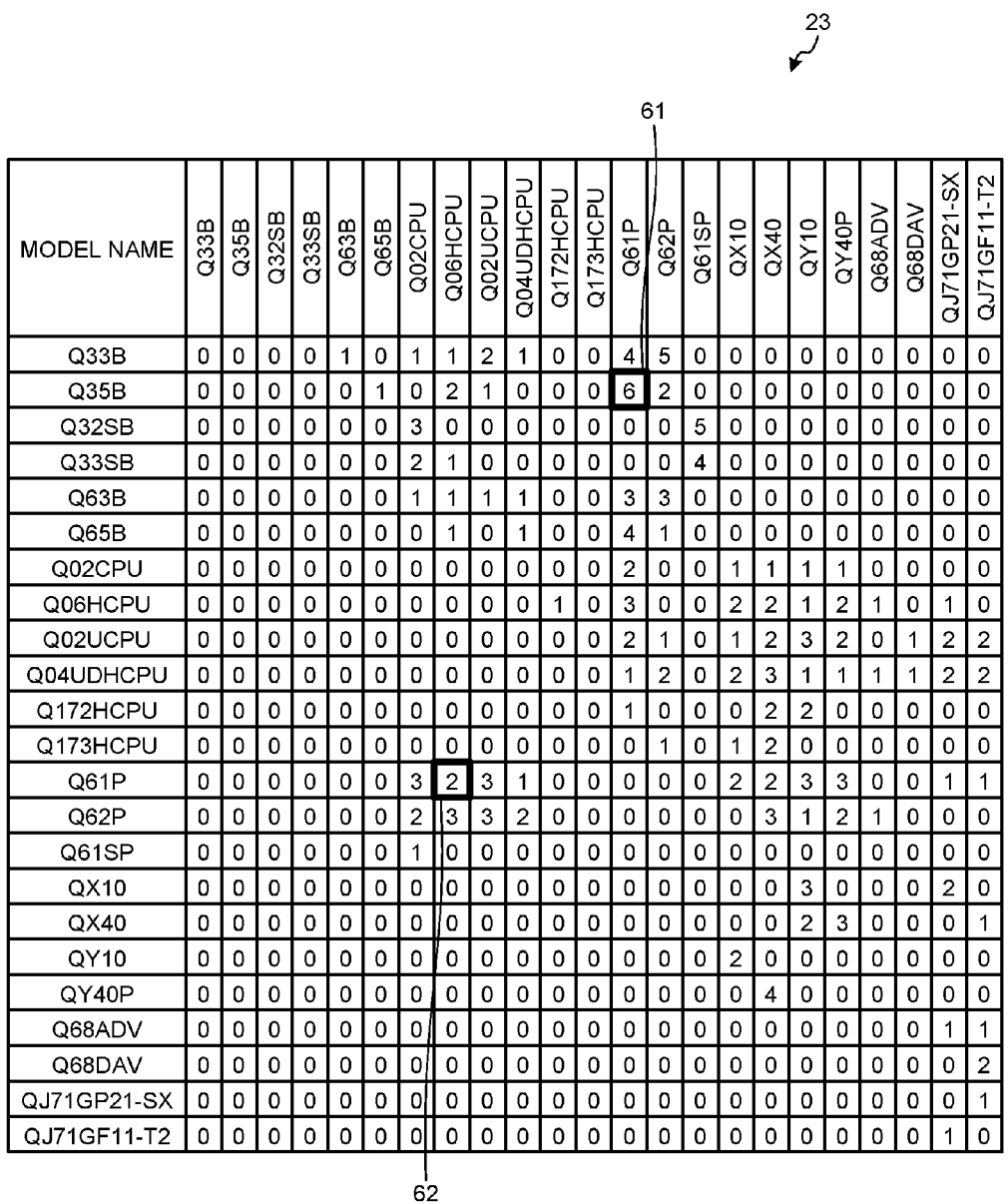
FIG. 9 is a diagram illustrating an example data configuration of first summary information.

FIG. 9 is a diagram illustrating an example data configuration of the first summary information 23. The first summary information 23 has a table format including rows and columns. The model names of all the units are recorded in the row direction and the column direction, so that the rows and the columns are each identified by a model name. Each cell records a count value. The combination of a row and a column represents the combination described above of units. Here, a row indicates a unit that is selected immediately before a unit indicated in a column.

For example, when the unit "Q35B", the unit "Q61P", and the unit "Q06HCPU" are selected in this sequence, the count section 26 increments each count value recorded in a cell 61 and a cell 62 by one.

The count section 26 also aggregates the count values recorded in the first summary information 23 for each category recorded in the classification information 22. The count section 26 records the count values of each category in the second summary information 24.

FIG. 10 is a diagram illustrating an example data configuration of the second summary information 24. As illustrated, the second summary information 24 has a configuration that aggregates for each category the rows and the columns of the first summary information 23.

When one unit has been selected by a new unit selection input and before a next unit selection input is made, the candidate category presentation section 27 predicts a category to which a unit to be selected by the next unit selection input belongs on the basis of the second summary information 24 and presents the predicted category as a candidate category to the user.

In the first embodiment, the candidate category presentation section 27 determines that a category including units most frequently selected after the category to which the selected unit belongs should be the candidate category. The candidate category presentation section 27 then scrolls the content being displayed on the unit list display screen 102 such that the candidate category is displayed at the top of the display space on the unit list display screen 102. When presenting a candidate category, the candidate category presentation section 27 may display the candidate category in the unfolded manner or in the folded manner. The candidate category presentation section 27 may perform scrolling without changing the display form existing before the presentation.

For example, when the unit "Q35B" is selected, the candidate category presentation section 27 determines that the unit "Q35B" belongs to the category "fundamental base" by referring to the classification information 22. The candidate category presentation section 27 then uses the category name "fundamental base" to search the rows in the second summary information 24. The candidate category presentation section 27 then searches the cells included in the row of the category name "fundamental base" and determines that the cell storing the largest value is the cell determined by this row and the column with the category name "power unit". Subsequently, the candidate category presentation section 27 scrolls the content being displayed on the unit list display screen 102 such that the category name "power unit" is displayed at the top.

Figure 11:
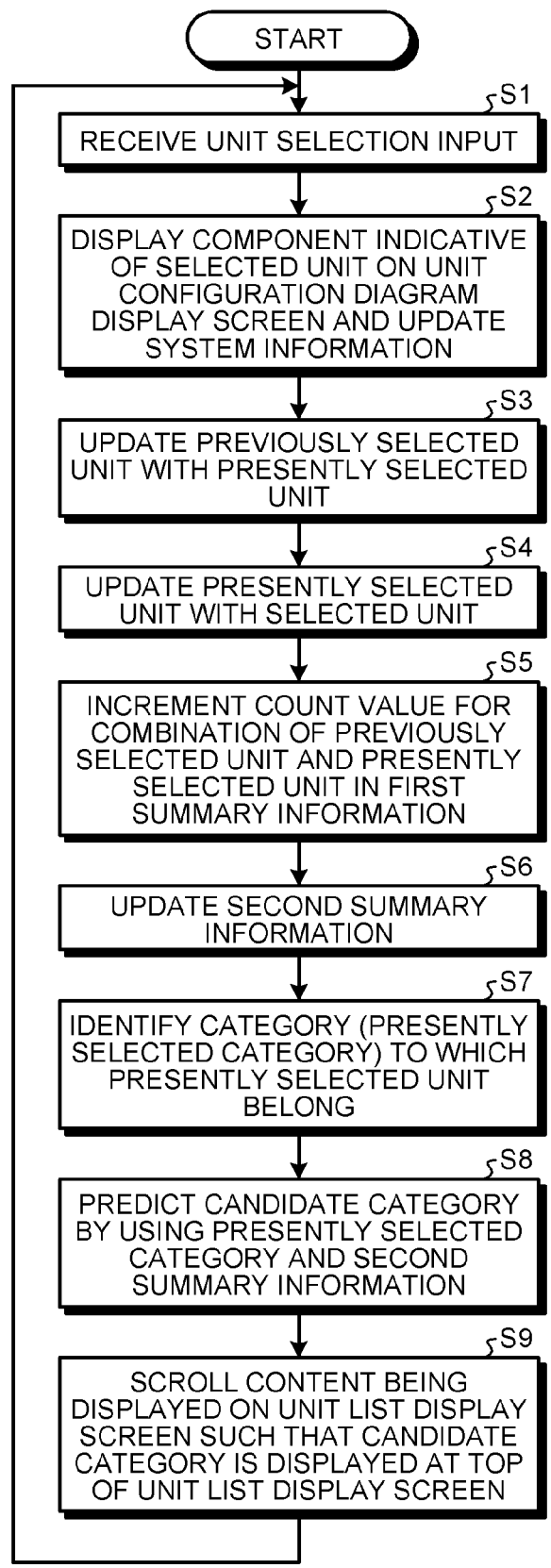
FIG. 11 is a flowchart describing the actions of the system construction assistance apparatus in the first embodiment.

FIG. 11 is a flowchart describing the actions of the assistance apparatus 1 in the first embodiment. The processing section 20 temporarily stores a unit selected last and a unit selected and placed immediately before the unit selected last. Here, the processing section 20 stores a unit selected last as a presently selected unit and a unit selected immediately before the unit selected last as a previously selected unit.

The processing section 20 receives a unit selection input (S1). The processing section 20 then displays a component indicative of the unit selected in the processing of S1 on the unit configuration diagram display screen 101 and updates the system information 25 (S2).

Subsequently, the processing section 20 stores a unit that is stored as a presently selected unit, as a previously selected unit in an overwrite mode (S3). The processing section 20 then stores the unit selected in the processing of S1 as a presently selected unit in an overwrite mode (S4).

Subsequently, the count section 26 increments a count value recorded in the first summary information 23 for the combination of the previously selected unit and the presently selected unit (S5). More specifically, the count section 26 identifies a column that indicates the presently selected unit in the first summary information 23 and a row that indicates the previously selected unit in the first summary information 23. The count section 26 then uses the identified column and row to identify a cell to record a count value for the combination of the presently selected unit and the previously selected unit.

Subsequently, the count section 26 updates the second summary information 24 (S6).

The processing of S6 is performed as described more specifically below. The count section 26 refers to the classification information 22 to obtain a category (presently selected category) to which the presently selected unit belongs and a category (previously selected category) to which the previously selected unit belongs. The count section 26 then identifies a column that indicates the presently selected category in the second summary information 24 and a row that indicates the previously selected category in the second summary information 24. The count section 26 then uses the identified column and row to identify a cell to record a count value for the combination of the presently selected category and the previously selected category. The count section 26 then increments the count value recorded in the identified cell by one.

Note that, in the processing of S6, the count section 26 may perform processing to aggregate for each category the count values recorded in the first summary information 23 to newly generate the second summary information 24 and update the second summary information 24 existing before the processing of S6 with the newly generated second summary information 24.

The processing of S6 is performed every time the processing of S5 is performed; however, the processing of S6 may be performed at any timing.

Subsequently, the candidate category presentation section 27 refers to the classification information 22 to identify a category (presently selected category) to which the presently selected unit belongs (S7). The candidate category presentation section 27 then uses the presently selected category and the second summary information 24 to predict a candidate category (S8).

For example, the processing of S8 is performed as described more specifically below. The candidate category presentation section 27 identifies a row that indicates the presently selected category in the second summary information 24. The candidate category presentation section 27 then identifies a cell that records the largest count value from the cells included in the identified row. The candidate category presentation section 27 then identifies a category indicated by the column to which the identified cell belongs. The candidate category presentation section 27 then determines that the identified category should be the candidate category.

The candidate category presentation section 27 then scrolls the content being displayed on the unit list display screen 102 such that the candidate category is displayed at the top of the unit list display screen 102 (S9). Subsequently, the processing of S1 is performed again.

Note that, when the user creates a next system configuration diagram after completing one system configuration diagram, the first summary information 23 existed at the time of the completion will be used with the count values not reset. This will be the case also for the second summary information 24.

As described above, in the first embodiment, after receiving an input to newly select a unit and before receiving an input to select a next unit, the processing section 20 predicts a category to which a unit to be selected next belongs on the basis of a plurality of inputs received in the past and presents the predicted category as a candidate category to the user. Predicting and presenting a next unit on the basis of count values per unit may result in lowered accuracy of prediction if the number of inputs to select a unit (the number of times the processing of S1 is performed) is small in relation to the number of selectable units. The processing section 20 predicts a unit to be selected next, not on a per unit basis, but on a per category basis, which is a larger basis than the per unit basis, thereby enabling improvement in accuracy of prediction over prediction on a per unit basis even if the number of inputs to select a unit is small. Hence, the convenience of the assistance apparatus 1 can be improved.

Additionally, in the processing section 20, the count section 26 aggregates, for each category combination, the information as to which category a unit selected after a unit belonging to one category is selected belongs to, and the candidate category presentation section 27 predicts a candidate category on the basis of the count values of each category combination. This enables the processing section 20 to predict a unit to be selected next, not on a per unit basis, but on a per category basis, which is a larger basis than the per unit basis.

Additionally, the count section 26 records count values of each category combination in the second summary information 24. The candidate category presentation section 27 identifies a category to which a unit newly selected belongs and identifies a combination having the largest count value from combinations including the identified category as one of the categories (of the two categories included in a combination, the category including a unit selected previously). The candidate category presentation section 27 then determines that the other category included in the identified combination should be a candidate category. This enables the processing section 20 to predict a unit to be selected next, not on a per unit basis, but on a per category basis, which is a larger basis than the per unit basis.

Note that the classification information 22 may record a plurality of patterns of classification. For example, a plurality of classification patters designed per purpose may be prepared, such as a classification pattern suitable for the construction of a system for water processing and a classification pattern suitable for the construction of a system for vehicle assembly. A plurality of classification patterns may also be prepared, with each pattern differing depending on the size of the system.

Figure 13:
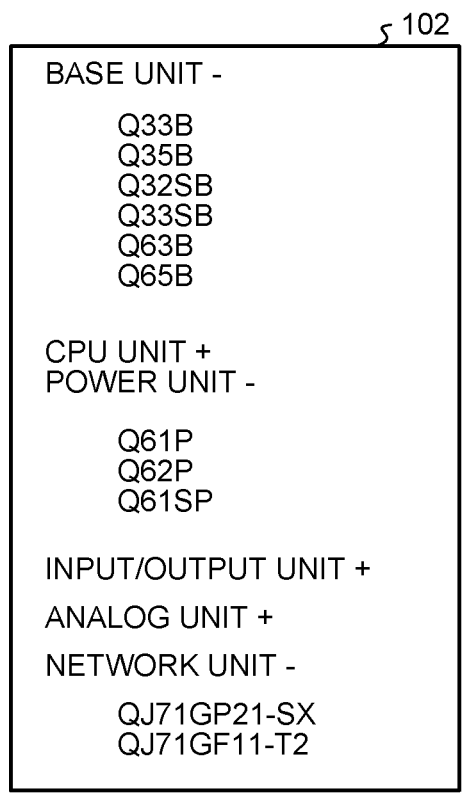
FIG. 13 is a diagram illustrating another example of the display of the unit list display screen.

FIG. 12 is a diagram illustrating another example data configuration of the classification information. Classification information in which a plurality of patterns of classification is recorded is designated with a symbol 22a for differentiation from the classification information 22 illustrated in FIG. 6. As illustrated in FIG. 12, the classification information 22a includes two patterns of classification information 22-1 and 22-2. The classification information 22-1 is identical to the classification information 22 illustrated in FIG. 6. The classification information 22-2 has the units listed in the unit list 21 classified with a method different from that of the classification information 22-1. For example, unit groups classified separately into the category "fundamental base" and the category "add-on base" in the classification information 22-1 are integrated into a category "base unit" in the classification information 22-2. Unit groups classified separately into the category "sequencer CPU" and the category "motion CPU" in the classification information 22-1 are also integrated into a category "CPU unit" in the classification information 22-2. FIG. 13 is a diagram illustrating an example of the display of the unit list display screen 102 when the classification information 22-2 is used.

When units are classified in accordance with a plurality of classification patterns as in the classification information 22a, the processing section 20 selects a classification pattern for use from the plurality of classification patterns. For example, when the user inputs an instruction to switch classification patterns, the processing section 20 switches the classification patterns for use. The processing section 20 may be configured to receive an input to designate a classification pattern.

The configuration to switch a classification pattern for use from a plurality of classification patterns in the manner described above can further improve the convenience for the user.

In the description above, the candidate category presentation section 27 scrolls the content being displayed on the unit list display screen 102 such that a candidate category is displayed at the top of the unit list display screen 102; however, the form in which a candidate category is presented to the user is not limited thereto. For example, the candidate category presentation section 27 may display a candidate category in the unfolded manner and display categories other than the candidate category in the folded manner. The candidate category presentation section 27 may also highlight the candidate category. Highlighting, for example, includes using a different character color, using a different font, using a different background color, and blinking only a relevant portion.

The processing section 20 may also be configured to export and import all or some of the unit list 21, the classification information 22, the first summary information 23, and the second summary information 24 to and from an external source. This allows the user to change the computers used as the assistance apparatus 1 with the history executed in the computer before the change transferred to the computer after the change. This also allows a provider of the assistance apparatus 1 to create in advance and provide all or some of the classification information 22, the first summary information 23, and the second summary information 24 to the end user; thus, even a new end user who begins using the assistance apparatus 1 can obtain a highly accurate prediction result from the beginning.

Second Embodiment

In the first embodiment, the processing section 20 presents a candidate category every time the processing of S1 is performed without the need for a separate input from the user. In the second embodiment, the processing section 20 monitors an input to provide an instruction to present a candidate category (first presentation instruction input) from the user, and presents a candidate category when the first presentation instruction input is made and presents no candidate category when no first presentation instruction input is made. Any action may be designed as the first presentation instruction input. For example, an action to click on a blank portion of the unit list display screen 102 may be set as the first presentation instruction input.

Figure 14:
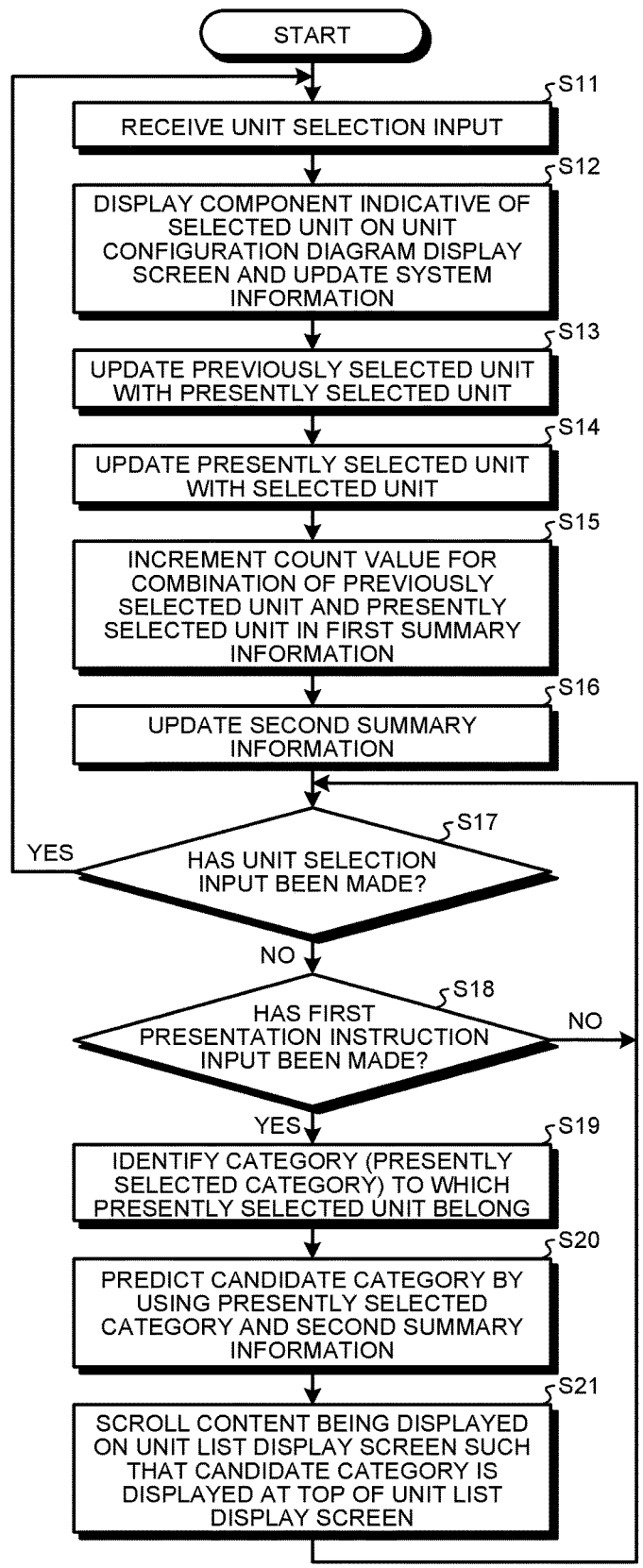
FIG. 14 is a flowchart describing the actions of the system construction assistance apparatus in a second embodiment.

FIG. 14 is a flowchart describing the actions of the system construction assistance apparatus in the second embodiment.

In S11 to S16, processing identical to that in S1 to S6 is performed. Subsequently to the processing of S16, the processing section 20 determines whether a next input to select and place one unit has been made (S17). If a next input has been made (S17, Yes), the processing of S11 is performed again.

If a next input has not been made (S17, No), the processing section 20 determines whether the first presentation instruction input has been made (S18). If the first presentation instruction input has not been made (S18, No), the processing of S17 is performed again. If the first presentation instruction input has been made (S18, Yes), processing identical to that in S7 to S9 is performed in S19 to S21. After the processing of S21, the processing of S17 is performed again.

As described above, the processing section 20 presents a candidate category when the first presentation instruction input is made by the user, allowing a candidate category to be presented when the user wishes one and no candidate category to be presented when the user does not wish one.

Third Embodiment

In a third embodiment, the processing section 20 monitors an input to provide an instruction to present a next candidate category (second presentation instruction input) from the user. If the second presentation instruction input is made while a candidate category is being presented to the user, the processing section 20 changes the candidate category.

Figure 15:
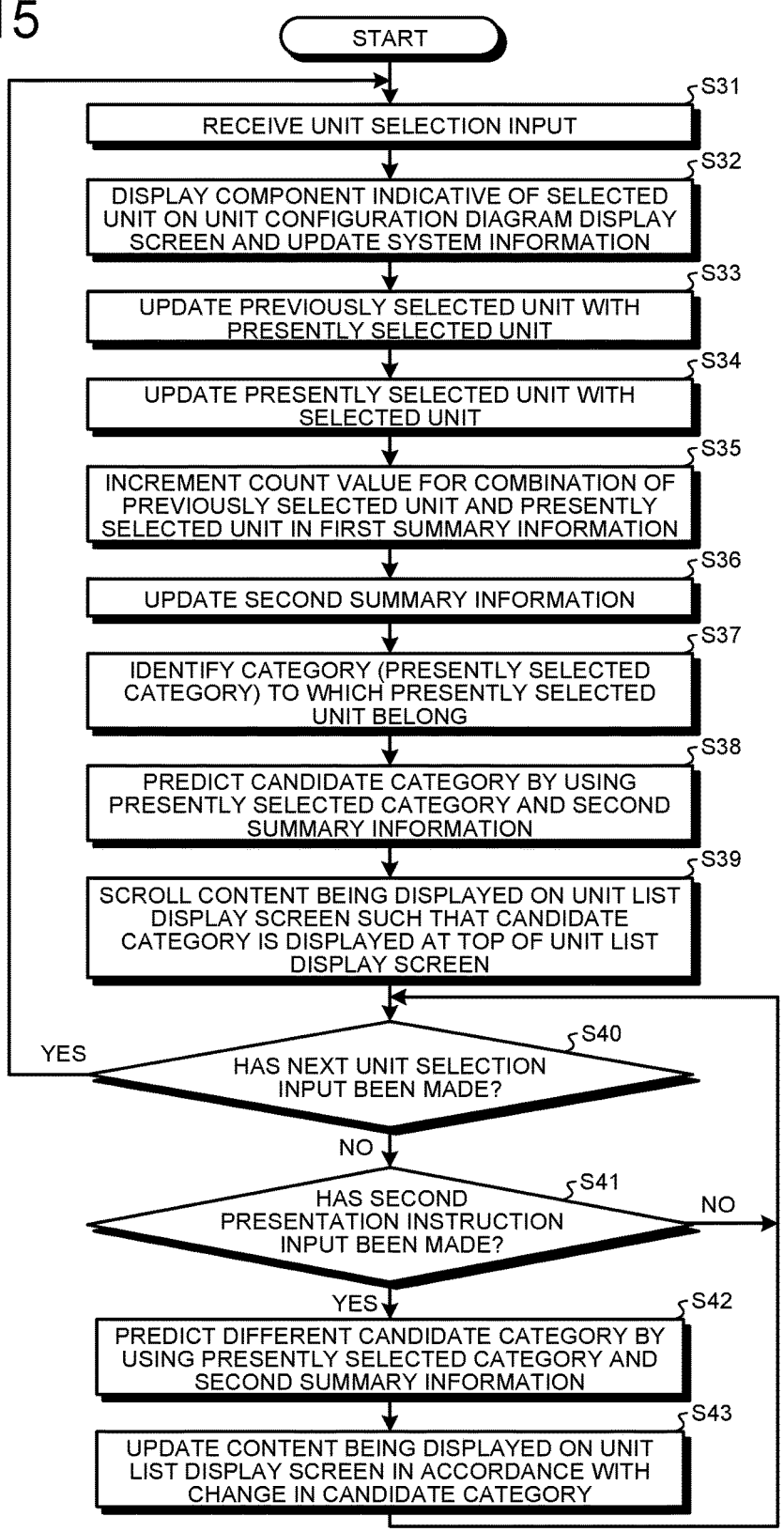
FIG. 15 is a flowchart describing the actions of the system construction assistance apparatus in a third embodiment.

FIG. 15 is a flowchart describing the actions of the system construction assistance apparatus in the third embodiment.

In S31 to S39, processing identical to that in S1 to S9 is performed. Subsequently to the processing of S39, the processing section 20 determines whether a next unit selection input has been made (S40). If a next unit selection input has been made (S40, Yes), the processing of S31 is performed again.

If a next unit selection input has not been made (S40, No), the processing section 20 determines whether the second presentation instruction input has been made (S41). If the second presentation instruction input has not been made (S41, No), the processing of S40 is performed again.

If the second presentation instruction input has been made (S41, Yes), the candidate category presentation section 27 uses the presently selected category and the second summary information 24 to predict a different candidate category (S42).

For example, the processing of S42 is performed as described more specifically below. The candidate category presentation section 27 identifies a row that indicates the presently selected category in the second summary information 24. The candidate category presentation section 27 then identifies, from the cells included in the identified row, a cell that records the largest count value next to the count value recorded in the cell identified by the column indicated by the candidate category. The candidate category presentation section 27 then determines that a category indicated by the column to which the identified cell belongs should be a different candidate category.

The candidate category presentation section 27 then updates the content being displayed on the unit list display screen such that the identified different candidate category is presented as a new candidate category (S43). That is, the content being displayed on the unit list display screen 102 is updated such that the different candidate category predicted in the process of S42 is displayed at the top of the unit list display screen 102. After the processing of S42, the processing of S40 is performed again.

As described above, in the third embodiment, every time the user enters the next candidate presentation input, the processing section 20 makes an update with a category having the largest count value next to that of the category being presented as the candidate category and also updates the presentation; thus, the assistance apparatus 1 can present a candidate category having the next highest possibility to be selected even if the category having the largest count value does not include a unit the user wishes to select. This further improves the convenience for the user.

Fourth Embodiment

For actual PLCs, categories exist in which an upper limit is set on the number of placeable units, as in a case in which only a certain number of CPU units can be placed in a system.

In a fourth embodiment, the processing section 20 predicts a candidate category from a group of categories that have not reached the upper limit values for the number of placeable units (limit value). More specifically, the assistance apparatus 1 in the fourth embodiment further stores maximum placement number information 28 as limitation information that records the number of placeable units for each category. The maximum placement number information 28 is stored in the storage within the storage device 14.

FIG. 16 is a diagram illustrating an example data configuration of the maximum placement number information 28. The maximum placement number information 28 has recorded, for each unit, entries including an index, a model name, a number limitation, and designation of units deemed identical. The units deemed identical are units that are counted as identical units in order to determine whether the number of units that have already been chosen and placed on the unit configuration diagram display screen 101 has reached a threshold or not. The designation of units deemed identical is described by using the indexes. In the example illustrated in the figure, the limit value for the unit "Q33B" is "1", and the units deemed identical to this unit are the unit "Q33B", the unit "Q35B", the unit "Q32SB", and the unit "Q33SB". That is, if one of the unit "Q35B", the unit "Q32SB", and the unit "Q33SB" is selected and placed on the unit configuration diagram display screen 101, the number of placed units reaches "1", which is the limit value, and thus the unit "Q33B" cannot be newly placed. Under the designation of units deemed identical, common values within a category are registered. For example, the unit "Q33B", the unit "Q35B", the unit "Q32SB", and the unit "Q33SB" belong to the category "fundamental base" defined in the classification information 22-1, and, for these units, values indicating the same unit group are stored under the designation of units deemed identical.

Figure 17:
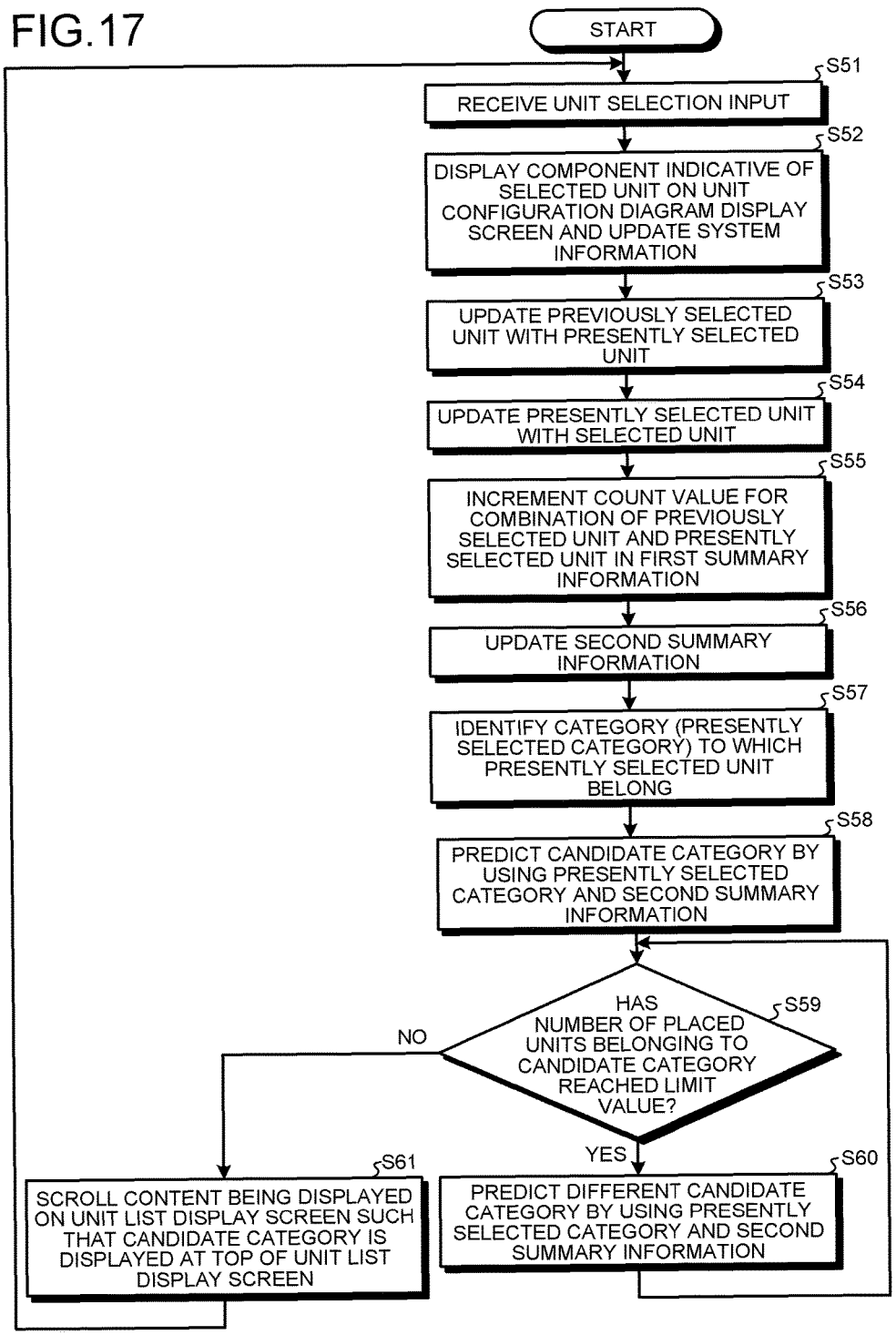
FIG. 17 is a flowchart describing the actions of the system construction assistance apparatus in a fourth embodiment.

FIG. 17 is a flowchart describing the actions of the system construction assistance apparatus in the fourth embodiment.

In S51 to S58, processing identical to that in S1 to S8 is performed. Subsequent to the processing of S58, the processing section 20 determines whether the number of placed units belonging to the candidate category has reached the limit value by referring to the maximum placement number information 28 (S59). If the number of placed units belonging to the candidate category has reached the limit value (S59, Yes), the candidate category presentation section 27 uses the presently selected category and the second summary information 24 to predict a different candidate category (S60).

For example, the processing of S60 is performed as described more specifically below. The candidate category presentation section 27 identifies a row that indicates the presently selected category in the second summary information 24. The candidate category presentation section 27 then identifies, from the cells included in the identified row, a cell that records the largest count value next to the count value recorded in the cell identified by the column indicated by the candidate category. The candidate category presentation section 27 then determines that a category indicated by the column to which the identified cell belongs should be a different candidate category.

After the processing of S60, the processing of S59 is performed again.

If the number of placed units belonging to the candidate category has not reached the limit value (S59, No), the candidate category presentation section 27 scrolls the content being displayed on the unit list display screen 102 such that the candidate category is displayed at the top of the unit list display screen 102 (S61). The processing of S51 is then performed again.

As described above, in the fourth embodiment, the processing section 20 predicts a candidate category from a group of categories that have not reached the upper limit value for the number of placeable units. This allows the user to eliminate the need to consider whether a desired unit is placeable, thus further improving the convenience for the user.

Fifth Embodiment

In a fifth embodiment, when the user selects one unit, the processing section 20 displays a plurality of categories in a form in which the descending order of count values can be identified by the user.

Figure 18:
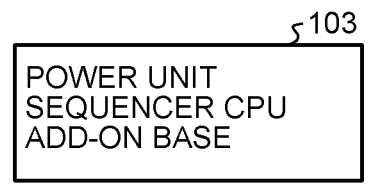
FIG. 18 is a diagram illustrating an example of the display of the listing of categories.

FIG. 18 is a diagram illustrating an example of the display of the listing of categories. As illustrated, a category display screen 103 displays a plurality of category names listed vertically such that a category name indicating a category having a larger count value is at an upper position in the list.

After the processing of S7, the candidate category presentation section 27 determines the descending order of count values of combinations recorded in the cells included in the row indicating the category identified by the processing of S7 in the second summary information 24 and displays the category names listed in the determined order in the category display screen 103. When one of the categories is selected from the category display screen 103, the candidate category presentation section 27 determines that the selected category should be a candidate category.

In the fifth embodiment, the processing section 20 displays the plurality of categories in a form in which the descending order of count values can be identified by the user, improving the convenience to the user.

REFERENCE SIGNS LIST

1 system construction assistance apparatus, 11 input device, 12 display device, 13 operation device, 14 storage device, 15 communication I/F device, 16 communication line, 17 PLC, 20 processing section, 21 unit list, 22, 22a, 22-1, 22-2 classification information, 23 first summary information, 24 second summary information, 25 system information, 26 count section, 27 candidate category presentation section, 28 maximum placement number information, 41 to 45 component, 61, 62 cell, 100 display screen, 101 unit configuration diagram display screen, 102 unit list display screen, 103 category display screen, 140 system construction assistance program, 200 scroll bar.

The invention claimed is:

1. A system construction assistance apparatus, comprising:
- a memory configured to store a first summary information and a second summary information;
- at least one display comprising a first display screen and a second display screen; and
- a processor configured to control the display to display, on the first display screen, a plurality of units, which are components connectable to slots of a programmable logic controller, each of the plurality of units belonging to one of a plurality of categories comprising a power source category, a central processing unit category, and a motion control category, such that the units are sorted by category, receive a first input to select one unit from the units displayed on the first display screen, based on the received first input, generate a system configuration diagram, and control the display to display the generated system configuration diagram on the second display screen,
- wherein, after the first input is received by the processor and before a next input is received by the processor, the processor is further configured to predict, on a per category basis which is a larger basis than a per unit basis, a category from among the plurality of categories to which a unit to be selected by the next input belongs based on a category from among the plurality of categories of the selected one unit and based on a plurality of first inputs received in a past, and control the display to display the predicted category as a candidate category,
- wherein the processor is further configured to:
  - count for each of selection combinations comprising a first unit from a first category and a second unit from a second category that is selected before the first unit, a number of times the first unit and the second unit are selected in combination,
  - control the memory to store the number of times in the first summary information as a count value for the respective selection combination from among the selection combinations,
  - update the second summary information, which indicates per category selection combinations, based on the count value stored in the first summary information, and
- wherein the processor predicts the candidate category based on values stored in the second summary information.

2. The system construction assistance apparatus according to claim 1, wherein:
- the processor aggregates, for each combination of the first category of the categories and the second category of the categories, number of times a first unit belonging to the first category is selected and then a second unit belonging to the second category is selected based on a selection sequence of units selected by the first inputs received in the past, and
- the processor predicts the candidate category based on a count value of each of the category selection combinations.

3. The system construction assistance apparatus according to claim 2,
wherein:
- the processor records a count value of each of the combinations in the second summary information,
- the processor identifies a combination having a largest count value recorded in the second summary information from a group of combinations including, as the first category, a category to which a unit, selected by newly received said first input, belongs, and
- the processor determines that a category included as the second category in the identified combination is a candidate category.

4. The system construction assistance apparatus according to claim 3, wherein
- the processor monitors reception of a third input,
- in response to the processor receiving the third input, the processor identifies a second combination having a largest count value, recorded in the second summary information, next to the combination including the candidate category as the second category, from the group of combinations including as the first category a category to which a unit, selected by the received first input, belongs, and
- the processor updates the candidate category with a category included as the second category in the identified second combination.

5. The system construction assistance apparatus according to claim 3, wherein
- each first input is an input to select one unit from the units displayed on the first display screen and place the selected unit on the second display screen,
- the memory stores in advance limitation information in which is recorded number of placeable units for each category, and
- the processor determines a candidate category from categories in which number of units already selected has not reached number of placeable units based on the limitation information.

6. The system construction assistance apparatus according to claim 3, wherein
- the processor exports and imports the second summary information based on an instruction from a user.

7. The system construction assistance apparatus according to claim 3, wherein:
- the processor aggregates, for each combination of a first unit of the units and a second unit of the units, number of times the first unit is selected and then the second unit is selected based on a selection sequence of units selected by the first inputs received in a past,
- the processor records a count value of each combination of the first unit and the second unit in the first summary information,
- the processor generates the second summary information based on the first summary information, and
- the processor exports and imports the first summary information based on an instruction from a user.

8. The system construction assistance apparatus according to claim 2, further comprising a third display screen, wherein:
- the processor records a count value of each of the combinations in the second summary information,
- the processor identifies a descending order of count values, recorded in the second summary information, of combinations including as the first category a category to which a unit, selected by newly received said first input, belongs,
- the processor controls the display to display, on the third display screen, categories each included as the second category in the combinations such that the categories are listed in the identified order, and
- in response to the processor receiving a fourth input to select one category from the third display screen, the processor determines that a category selected by the received fourth input is a candidate category.

9. The system construction assistance apparatus according to claim 1, wherein, after a first input is newly received and before a next first input is received, the processor monitors reception of a second input, and, when the second input is received, the processor presents the candidate category to a user.

10. The system construction assistance apparatus according to claim 1, wherein the memory is further configured to store in advance a unit list in which is recorded a plurality of units to be displayed on the first display screen and classification information in which is recorded which one of the categories the units recorded in the unit list each belong to, and wherein the processor determines a category each unit belongs based on the classification information.

11. The system construction assistance apparatus according to claim 10, wherein:

the memory stores a plurality of pieces of the classification information, and the processor selects classification information to be used from the plurality of pieces of the classification information.

12. The system construction assistance apparatus according to claim 1, wherein the processor presents the candidate category to a user by scrolling display positions of units belonging to the candidate category of the units to a top end of the second display screen.

13. The system construction assistance apparatus according to claim 1, wherein:

when the units are displayed on the first display screen such that the units are sorted by category, the processor is configured to control the display to display the units such that a first display form, in which a category name alone is displayed, and a second display form, in which a category name and all units belonging to the category of the units are both displayed, are selectable for each category, and the processor controls the display to present the candidate category to a user by displaying units belonging to the candidate category of the units in the second display form and displaying units not belonging to the candidate category of the units in the first display form.

14. The system construction assistance apparatus according to claim 1, wherein the processor is configured to control the display to present the candidate category to a user by highlighting units belonging to the candidate category of the units in the second display screen.

15. The system construction assistance apparatus according to claim 1, wherein the components are mountable onto a base of the programmable logic controller and are connected to a respective slot from among the slots of the base, wherein, based on categories of the components selected by the first input during a configuration of the programmable logic controller and based on a number of components in the categories of the components selected by the first input, the category for a next component is determined, wherein the display displays the determined category prior to the next input, and wherein the categories comprise a base category, the central processing unit (CPU) category, the power source category, the motion control category comprising a motion CPU category and a sequencer CPU category, an input component category, an output component category, and a network category.

16. The system construction assistance apparatus according to claim 1, wherein the second summary information comprises a count value for each category recorded in the first summary information.

17. A method comprising:

displaying, on a first display screen included in a computer, a plurality of units, which are components connectable to slots of a programmable logic controller, each of the plurality of units belonging to one of a plurality of categories comprising a power source category, a central processing unit category, and a motion control category, such that the units are sorted by category;

receiving, by the computer, a first input to select one unit from the displayed units;

generating, by the computer, a system configuration diagram based on the received first input;

displaying the generated system configuration diagram on a second display screen included in the computer; and after the receiving of the first input and before receiving a next input, determining, on a per category basis which is a larger basis than a per unit basis, a category from among the plurality of categories to which a unit to be selected by the next input belongs based on a category from among the plurality of categories of the selected one unit and based on a plurality of first inputs received in a past and outputting the determined category as a candidate category, and wherein the determining the candidate category comprises:

counting for each of selection combinations comprising a first unit from a first category and a second unit from a second category that is selected before the first unit, a number of times the first unit and the second unit are selected in combination, storing, in a memory, a first summary information comprising a count value, obtained based on the counting, indicating the number of times the respective selection combination was selected from among the selection combinations, updating a second summary information, which indicates per category selection combinations, based on the count value stored in the first summary information, and determining the candidate category based on values stored in the second summary information.

18. A non-transitory computer readable recording medium having recorded a program for causing a computer to execute:

displaying, on a first display screen, a plurality of units, which are components connectable to slots of a programmable logic controller, each of the plurality of units belonging to one of a plurality of categories comprising a power source category, a central processing unit category, and a motion control category, such that the units are sorted by category;

receiving a first input to select one unit from the units displayed on the first display screen;

generating a system configuration diagram based on the received first input and displaying the generated system configuration diagram on a second display screen; and after the receiving of the first input and before a next input is received, determining, on a per category basis which is a larger basis than a per unit basis, a category from among the plurality of categories to which a unit to be selected by the next input belongs based on a category from among the plurality of categories of the selected one unit and based on a plurality of first inputs received in a past and outputting the determined category as a candidate category, wherein the determining the candidate category comprises:

counting for each of selection combinations comprising a first unit from a first category and a second unit from a second category that is selected before the first unit, a number of times the first unit and the second unit are selected in combination, storing, in a memory, a first summary information comprising a count value, obtained based on the counting, indicating the number of times the respective selection combination was selected from among the selection combinations, updating a second summary information, which indicates per category selection combinations, based on the count value stored in the first summary information, and wherein the candidate category is determined based on values stored in the second summary information.

* * * * *